(12) United States Patent
Marino et al.

(10) Patent No.: US 11,855,588 B2
(45) Date of Patent: Dec. 26, 2023

(54) DIFFERENTIAL DRIVER

(71) Applicant: STMicroelectronics S.r.l., Agrate Brianza (IT)

(72) Inventors: Edoardo Marino, Milan (IT); Alessio Vallese, Bareggio (IT); Alessio Facen, Macerata (IT); Enrico Mammei, Vittuone (IT); Paolo Pulici, Legnano (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 170 days.

(21) Appl. No.: 17/581,334

(22) Filed: Jan. 21, 2022

(65) Prior Publication Data
US 2023/0238921 A1 Jul. 27, 2023

(51) Int. Cl.
*H03F 3/45* (2006.01)
*H03F 1/32* (2006.01)

(52) U.S. Cl.
CPC ........ *H03F 1/3211* (2013.01); *H03F 3/45179* (2013.01); *H03F 3/45479* (2013.01); *H03F 3/4508* (2013.01); *H03F 3/45085* (2013.01)

(58) Field of Classification Search
CPC ............... H03F 1/3211; H03F 3/45179; H03F 3/45479; H03F 3/4508; H03F 2203/45506; H03F 2203/45726; H03F 3/72; H03F 3/45098; H03F 3/45085; H03F 3/45475; H03F 3/45071; H03F 3/45183; H03F 3/45192; H03F 3/45089; H03F 3/45; H03G 1/0023; H03G 1/0088; H03G 3/45098; H03G 1/0052; H03G 1/007; H03G 3/3015
See application file for complete search history.

(56) References Cited

U.S. PATENT DOCUMENTS

| | | | |
|---|---|---|---|
| 5,621,356 A * | 4/1997 | Philippe | H03F 1/3211 330/252 |
| 5,666,078 A | 9/1997 | Lamphier et al. | |
| 5,760,601 A | 6/1998 | Frankeny | |
| 6,262,633 B1 * | 7/2001 | Close | H03F 3/3066 330/268 |
| 7,092,189 B2 | 8/2006 | Kuehlwein | |

(Continued)

FOREIGN PATENT DOCUMENTS

JP 2006208333 A 8/2006

*Primary Examiner* — Khanh V Nguyen
(74) *Attorney, Agent, or Firm* — Slater Matsil, LLP

(57) ABSTRACT

In an embodiment, an electronic circuit includes: an input differential pair including first and second transistors; a first pair of transistors in emitter-follower configuration including third and fourth transistors, and an output differential pair including fifth and sixth transistors. The third transistor has a control terminal coupled to the first transistor, and a current path coupled to a first output terminal. The fourth transistor has a control terminal coupled to the second transistor, and a current path coupled to a second output terminal. The fifth transistor has a control terminal coupled to the first transistor, and a first current path terminal coupled to the first output terminal. The sixth transistor has a control terminal coupled to the second transistor, and a first current path terminal coupled to the second output terminal. First and second termination resistors are coupled between the first pair of transistors and the output differential pair.

29 Claims, 8 Drawing Sheets

(56) References Cited

U.S. PATENT DOCUMENTS

| | | |
|---|---|---|
| 7,466,200 B2 | 12/2008 | Fischer |
| 8,791,758 B1 * | 7/2014 | Foroudi ................ H03F 1/3211 |
| | | 330/252 |
| 2001/0028261 A1 | 10/2001 | Aizawa |
| 2005/0094305 A1 | 5/2005 | Kuehlwein et al. |
| 2010/0026393 A1 | 2/2010 | Keerti et al. |

* cited by examiner

US 11,855,588 B2

DIFFERENTIAL DRIVER

TECHNICAL FIELD

The present disclosure relates generally to an electronic system and method, and, in particular embodiments, to a differential driver.

BACKGROUND

A hard-disk drive (HDD) may store information as magnetic fields in a magnetic disk. A magnetoresistance (MR) sensor disposed in a reading head may be used for reading data from the disk. The MR sensor may be understood as a sensor able to convert a magnetic field to a variable resistance. The value of the resistance exhibited by the MR sensor is related to the stored bit on the magnetic disk ("1" or "0"). For example, as the head passes over the surface of the disk, the resistance of the MR sensor changes based on the magnetic field corresponding to the stored magnetic patterns in the disk.

An HDD preamplifier reader block may be used to detect the change in resistance of the MR sensor, thereby allowing for reading data stored in the magnetic disk. For example, the HDD preamplifier reader block may bias the MR sensor with a bias DC voltage. As the resistance of the MR sensor changes, an AC component may develop across the resistance of the MR sensor. Such AC component (e.g., AC voltage) superimposed with the bias DC voltage, may be amplified and transmitted by the HDD preamplifier reader block. For example, an input stage of the HDD preamplifier reader block may supply the bias voltage to the MR sensor and amplify the sensed AC voltage across the MR sensor. An output stage of the HDD preamplifier reader block may supply, via transmission lines, the amplified AC voltage, e.g., to a system-on-chip (SoC). The SoC may detect the read data bits based on the amplified AC voltage, and may, e.g., apply error detection and correction techniques to the read data bits.

SUMMARY

In accordance with an embodiment, an electronic circuit includes: first and second input terminals configured to receive a differential input voltage; first and second output terminals configured to provide a differential output voltage based on the differential input voltage; a first supply terminal configured to receive a first supply voltage; an input differential pair including: a first transistor having a control terminal coupled to the first input terminal, and a first current path terminal coupled to the first supply terminal, and a second transistor having a control terminal coupled to the second input terminal, and a first current path terminal coupled to the first supply terminal; a first pair of transistors in emitter-follower configuration including: a third transistor having a control terminal coupled to the first current path terminal of the first transistor, a first current path terminal coupled to the first supply terminal, and a second current path terminal coupled to the first output terminal, and a fourth transistor having a control terminal coupled to the first current path terminal of the second transistor, a first current path terminal coupled to the first supply terminal, and a second current path terminal coupled to the second output terminal; an output differential pair including: a fifth transistor having a control terminal coupled to a second current path terminal of the first transistor, and a first current path terminal coupled to the first output terminal, and a sixth transistor having a control terminal coupled to a second current path terminal of the second transistor, and a first current path terminal coupled to the second output terminal; a first termination resistor coupled between the second current path terminal of the third transistor and the first current path terminal of the fifth transistor; and a second termination resistor coupled between the second current path terminal of the fourth transistor and the first current path terminal of the sixth transistor.

In accordance with an embodiment, a method includes: receiving a first supply voltage at a first supply terminal; receiving a differential input voltage between first and second input terminals with an input differential pair including: a first transistor having a control terminal coupled to the first input terminal, and a first current path terminal coupled to the first supply terminal, and a second transistor having a control terminal coupled to the second input terminal, and a first current path terminal coupled to the first supply terminal; generating a differential output voltage between first and second output terminals based on the differential input voltage by using a first pair of transistors in emitter-follower configuration, and an output differential pair; where the first pair of transistors includes: a third transistor having a control terminal coupled to the first current path terminal of the first transistor, a first current path terminal coupled to the first supply terminal, and a second current path terminal coupled to the first output terminal, and a fourth transistor having a control terminal coupled to the first current path terminal of the second transistor, a first current path terminal coupled to the first supply terminal, and a second current path terminal coupled to the second output terminal; where the output differential pair includes: a fifth transistor having a control terminal coupled to a second current path terminal of the first transistor, and a first current path terminal coupled to the first output terminal, and a sixth transistor having a control terminal coupled to a second current path terminal of the second transistor, and a first current path terminal coupled to the second output terminal; where a first termination resistor is coupled between the second current path terminal of the third transistor and the first current path terminal of the fifth transistor; and where a second termination resistor is coupled between the second current path terminal of the fourth transistor and the first current path terminal of the sixth transistor.

In accordance with an embodiment, a differential driver includes: first and second input terminals configured to receive a differential input voltage; first and second output terminals configured to provide a differential output voltage based on the differential input voltage; a first supply terminal configured to receive a first supply voltage; an input differential pair including: a first transistor having a control terminal coupled to the first input terminal, and a first current path terminal coupled to the first supply terminal, and a second transistor having a control terminal coupled to the second input terminal, and a first current path terminal coupled to the first supply terminal; a first pair of transistors in emitter-follower configuration including: a third transistor having a control terminal coupled to the first current path terminal of the first transistor, a first current path terminal coupled to the first supply terminal, and a second current path terminal coupled to the first output terminal, and a fourth transistor having a control terminal coupled to the first current path terminal of the second transistor, a first current path terminal coupled to the first supply terminal, and a second current path terminal coupled to the second output terminal; an output differential pair including: a fifth transistor having a control terminal coupled to a second current path terminal of the first transistor, and a first current path terminal coupled to the first output terminal, and a sixth transistor having a control terminal coupled to a second current path terminal of the second transistor, and a first current path terminal coupled to the second output terminal; a first termination resistor coupled between the second current path terminal of the third transistor and the first current path terminal of the fifth transistor; a second termination resistor coupled between the second current path terminal of the fourth transistor and the first current path terminal of the sixth transistor; a first degeneration resistor coupled between a second current path terminal of the fifth transistor and a second current path terminal of the sixth transistor; a second pair of transistors in emitter-follower configuration including: a seventh transistor having a control terminal coupled to the first current path terminal of the first transistor, a first current path terminal coupled to the first supply terminal, and a second current path terminal coupled to the first output terminal, and an eighth transistor having a control terminal coupled to the first current path terminal of the second transistor, a first current path terminal coupled to the first supply terminal, and a second current path terminal coupled to the second output terminal; a third termination resistor coupled between the second current path terminal of the seventh transistor and the first current path terminal of the fifth transistor; and a fourth termination resistor coupled between the second current path terminal of the eighth transistor and the first current path terminal of the sixth transistor.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

Figure 1:
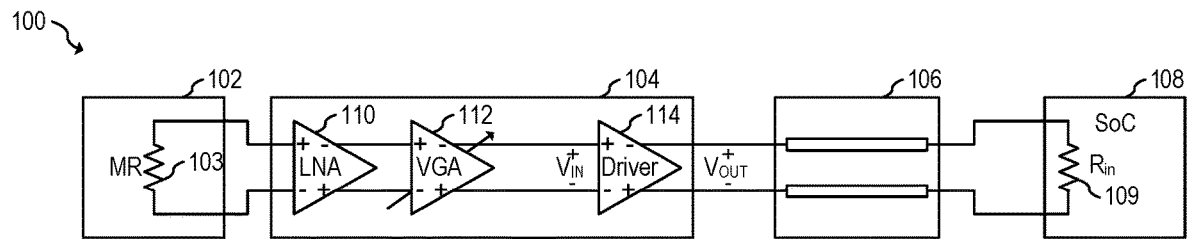
FIG. 1 shows a reading circuit of an HDD, according to an embodiment of the present invention.

The making and using of the embodiments disclosed are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The description below illustrates the various specific details to provide an in-depth understanding of several example embodiments according to the description. The embodiments may be obtained without one or more of the specific details, or with other methods, components, materials and the like. In other cases, known structures, materials or operations are not shown or described in detail so as not to obscure the different aspects of the embodiments. References to "an embodiment" in this description indicate that a particular configuration, structure or feature described in relation to the embodiment is included in at least one embodiment. Consequently, phrases such as "in one embodiment" that may appear at different points of the present description do not necessarily refer exactly to the same embodiment. Furthermore, specific formations, structures or features may be combined in any appropriate manner in one or more embodiments.

Embodiments of the present invention will be described in specific contexts, e.g., a low power differential driver with programmable output impedance that serves as an output stage of an HDD preamplifier reader block. Embodiments of the present invention may be used in other applications, such as serials interfaces, optical communications, and other applications in which high speed programmable output drivers may be desirable. Some embodiments may be implemented without a programmable output impedance.

In an embodiment of the present invention, a differential buffer includes an input differential pair for receiving a differential input voltage and an output stage implemented in a push-pull configuration for providing a differential output voltage based on the output of the input differential pair. The output stage includes a pair of emitter followers having inputs coupled to outputs of the input differential pair, and a differential output pair coupled to the pair of emitter followers. Termination resistors are couple between the pair of emitter followers and the output differential pair, which may advantageously help achieve a larger output voltage swing. The output differential pair includes degeneration resistors, which may advantageously lower distortion.

In some embodiments, the $$\frac{1}{gm}$$

metric of the pair of emitter follower transistors is comparable to the resistance of the termination resistors, which may advantageously allow for achieving lower power consumption. In some embodiments, the differential buffer has programmable output impedance while maintaining a constant gain irrespective of which programmable output impedance is selected.

FIG. 1 shows reading circuit 100 of an HDD, according to an embodiment of the present invention. Reading circuit 100 includes MR sensor 102, reader 104 (also referred to as HDD preamplifier reader block), transmission lines 106, and system-on-chip 108. During a reading operation, signals from the MR sensor 102 are amplified by reader 104 and transmitted to SoC 108 over transmission lines 106 for further elaboration.

As shown in FIG. 1, reader 100 includes low noise amplifier (LNA) no, variable gain amplifier (VGA) 112, and driver 114. In some embodiments, reader 104 includes a bias circuit (not shown) for providing a DC bias voltage across resistor 103.

In some embodiments, LNA no and VGA 112 are used to amplify the signals generated by MR sensor 102. In some embodiments, VGA 112 is capable of varying its gain from a few dB up to, e.g., 40 dB or more. Other implementations are also possible. In some embodiments, LNA no and VGA 112 may be implemented in any way known in the art.

In some embodiments, differential buffer 114 serves as an output stage of reader 104 and is used to transmit the signals delivered by VGA 112 over transmission lines 106, e.g., with an output impedance that matches the impedance of the transmission line 106 and the termination resistance $R_{in}$.

In some embodiments, transmission lines 106 may be, e.g., 50Ω transmission lines. Transmission lines with a different characteristic impedance, such as 100Ω or different, may also be used.

In some embodiments, SoC 108 has an input impedance $R_{in}$ that matches the impedance of transmission lines 106. In some embodiments, SoC 108 includes a resistor 109 having resistance $R_{in}$. Other implementations are also possible.

In some embodiments, MR sensor 102 includes variable MR resistor 103. MR sensor 102 may be implemented in any way known in the art.

Figure 2:
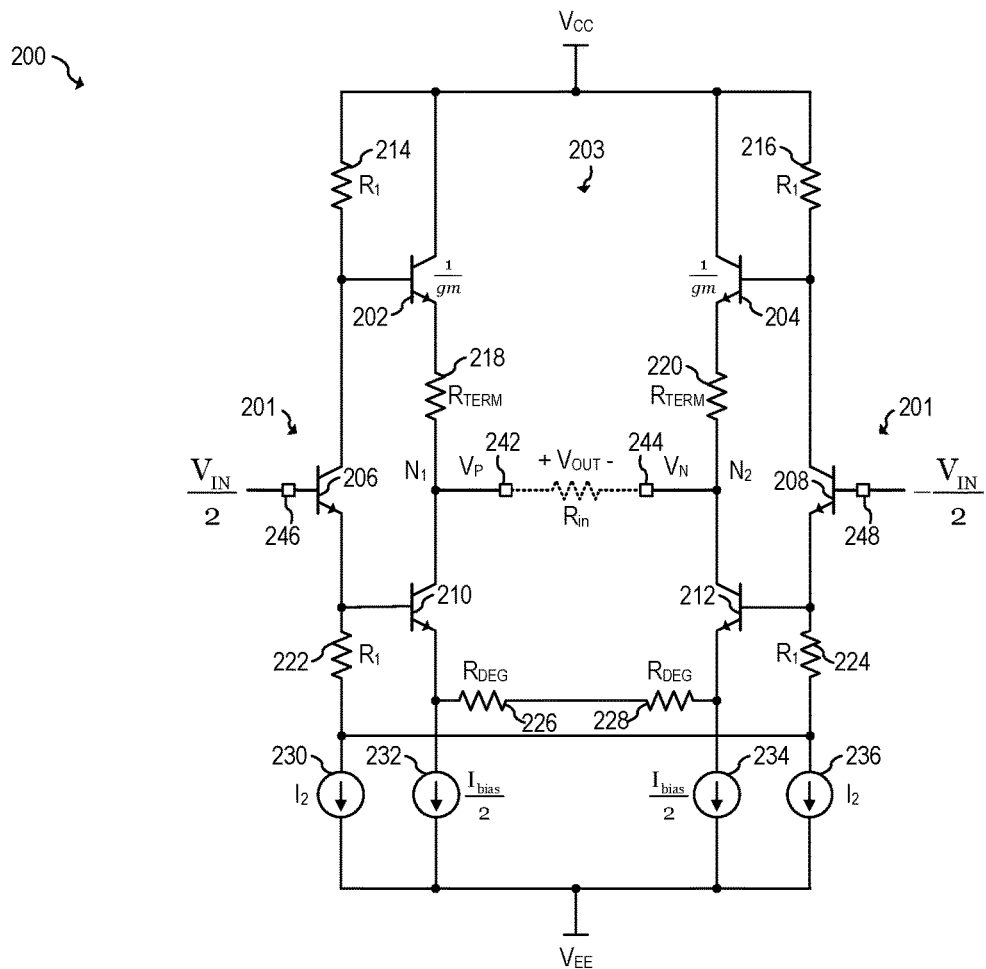
FIGS. 2-4 show schematic diagrams of buffers, according to embodiments of the present invention.

FIG. 2 shows a schematic diagram of buffer 200, according to an embodiment of the present invention. Buffer 114 may be implemented as buffer 200.

Buffer 200 includes bipolar junction transistors (BJTs) 202, 204, 206, 208, 210, and 212, resistors 214, 216, 218, 220, 222, 224, 226, and 228, and current sources 230, 232, 234, and 236. Input stage 201 includes transistors 206 and 208, where transistors 206 and 208 form an input differential pair. Output stage 203 includes transistors 202, 204, 210, and 212, where transistors 202 and 204 are implemented as emitter followers and transistors 210 and 212 form an output differential pair.

During normal operation, the input differential pair (206, 208) receives differential input voltage $V_{IN}$ superimposed over a common mode voltage (not shown). As input voltage $V_{IN}$ increases, the voltage at the base of transistor 206 increases while the voltage at the base of transistor 208 decreases, thereby causing transistor 206 to be turned on harder and causing transistor 208 to be turned on less hard, thereby causing the voltage at the base of transistor 202 to decrease and the voltage at the base of transistor 204 to increase. Since transistors 202 and 204 are configured as emitter followers, voltage $V_P$ decreases and voltage $V_N$ increases as input voltage $V_{IN}$ increases, thereby causing output voltage $V_{OUT}$ to decrease. In a similar manner, when input voltage $V_{IN}$ decreases, transistors 202 and 204 cause voltage $V_P$ to increase and voltage $V_N$ to decrease.

The output differential pair (210, 212) also causes a decrease of the voltage $V_P$ and an increase of voltage $V_N$ as input voltage $V_{IN}$ increases. For example, since transistor 206 turns on harder and transistor 208 turns on less hard when input voltage $V_{IN}$ increases, the voltage at the base of transistor 210 increases while the voltage at the base of transistor 212 decreases when input voltage $V_{IN}$ increase, thereby causing transistor 210 to be turned on harder and transistor 212 to be turned on less hard as input voltage $V_{IN}$ increases, thereby causing voltage $V_P$ to decrease and voltage $V_N$ to increase. In a similar manner, when input voltage $V_{IN}$ decreases, transistors 210 and 212 cause voltage $V_P$ to increase and voltage $V_N$ to decrease. Thus, in some embodiments, the output differential pair (210, 212) advantageously causes an increase in switching speed since the output differential pair (210, 212) cooperates with the emitter followers (202, 204) in pushing-pulling the voltages $V_P$ and $V_N$ based on input voltage $V_{IN}$.

In some embodiments, current sources 230 and 236 bias the input differential pair (206, 208) of input stage 201 and current sources 232 and 234 bias the output differential pair (210 and 212) of output stage 203. In some embodiments, current $I_{bias}$ (generated by current sources 232 and 234) is a PTAT current. In some embodiments, using a PTAT current for $I_{bias}$ advantageously keeps the transconductance gm of transistors 202, 204, 210 and 212 constant with temperature. In some embodiments, current sources 230, 232, 234, and 236 may be implemented in any way known in the art.

In some embodiments, $V_{CC}$ and $V_{EE}$ are equal to 5 V and −3 V, respectively. Other voltages may also be used. For example, in some embodiments, $V_{CC}$ may be lower than 5 V (e.g., 3.3 V, 1.8 V, or lower), or higher than 5 V (e.g., 5.5 V, 6 V, or higher). In some embodiments, $V_{EE}$ may be lower than −3 V (e.g., −4 V or lower) or higher than −3 V (e.g., −2.5 V or higher, such as ground, for example).

As shown in FIG. 2, in some embodiments, buffer 200 includes a push-pull output stage that includes transistors 202, 204, 210, and 212. By using a push-pull output stage, some embodiments are advantageously capable of operating at high speeds (e.g., up to a few GHz or higher) without increasing the power consumption of the buffer, e.g., when compared with a solution that does not use an output differential pair.

As shown in FIG. 2, in some embodiments, transistors 202, 204, 206, 208, 210, and 212 are transistors of the n-type. By using only n-type transistors, some embodiments are advantageously capable of operating at high speeds (e.g., up to a few GHz or higher), e.g., when compared with a solution using one or more p-type transistors in the input or output stages (since p-type transistors generally have lower cut-off frequency than n-type transistors).

Some embodiments may be implemented with p-type transistors.

As shown in FIG. 2, transistors 202, 204, 206, 208, 210, and 212 are BJTs. In some embodiments, transistors of other types, such as MOS transistors, may also be used.

As shown in FIG. 2, in some embodiments, the output differential pair (210, 212) is implemented with degeneration resistors (226, 228). In some embodiments, using degeneration resistors in the output differential pair advantageously allows for achieving lower distortion compared to implementations that do not use degeneration resistors. In some embodiments, using degeneration resistors in the output differential pair advantageously aids in matching the gain of a first path that includes elements 206, 208, 214, 216, 222, and 224, with a second path that includes elements $$\frac{1}{gm}$$

of transistor 202, and $$\frac{1}{gm}$$

of transistor 204, 210, 212, 218, 220, 226, and 228.

In some embodiments, the output voltage $V_{OUT}$ of buffer 200 may be given by $$V_{OUT} = V_{IN} \cdot \left[ \frac{\frac{R_{in}}{2}}{\frac{R_{in}}{2} + R_{TERM}} + \frac{gm \cdot \left[ \frac{\frac{R_{in}}{2} \cdot \left(R_{TERM} + \frac{1}{gm}\right)}{\frac{R_{in}}{2} + \left(R_{TERM} + \frac{1}{gm}\right)} \right]}{1 + gm \cdot R_{DEG}} \right], \quad (1)$$

where gm is the transconductance of transistors 202, 204, 210 and 212, $R_{in}$ represents the input resistance of SoC 108 (e.g., after transmission line 106), $R_{TERM}$ represents the resistance of resistors 218 and 220, $R_{DEG}$ represents the resistance of resistors 226 and 228, $V_{IN}$ represents the differential input voltage received at the base of transistors 206 and 208, and $V_{OUT}$ represents the differential output voltage delivered across output terminals 242 and 244.

In some embodiments, the transconductance gm of transistors 202 and 204 varies with voltage. Such variations may cause signal distortion and a spread of gain. In some embodiments, $$\frac{1}{gm}$$

is substantially smaller than $R_{TERM}$ (e.g., 1 order of magnitude smaller or smaller), thereby advantageously reducing the distortion and the spread of gain associated with variations in transconductance gm, thereby advantageously improving linearity and gain precision. Thus, in some embodiments, Equation 1 may be approximated as $$V_{OUT} = V_{IN} \cdot \left[ \frac{\frac{R_{in}}{2}}{\frac{R_{in}}{2} + R_{TERM}} + \frac{gm \cdot \left[ \frac{\frac{R_{in}}{2} \cdot R_{TERM}}{\frac{R_{in}}{2} + R_{TERM}} \right]}{1 + gm \cdot R_{DEG}} \right]. \quad (2)$$

In an embodiment in which $$R_{TERM} = \frac{R_{in}}{2}$$

and $R_{DEG} = R_{TERM}$, and where $$1 + gm \cdot \frac{R_{in}}{2} \gg 1,$$

output voltage $V_{OUT}$ may be given (e.g., based on Equation 2) as $$V_{OUT} = V_{IN} \cdot \left[ \frac{\frac{R_{in}}{2}}{\frac{R_{in}}{2} + \frac{R_{in}}{2}} + \frac{gm \cdot \left[ \frac{\frac{R_{in}}{2} \cdot \frac{R_{in}}{2}}{\frac{R_{in}}{2} + \frac{R_{in}}{2}} \right]}{1 + gm \cdot \frac{R_{in}}{2}} \right] \approx V_{IN}. \quad (3)$$

As illustrated by Equations 3, some embodiments achieve a unity gain between $V_{OUT}$ and $V_{IN}$, which may advantageously allow for lower input signals $V_{IN}$ (e.g., while keeping a fixed output swing) when compared with buffers with transfer functions with lower than unity gain, such as a gain of 0.5.

As shown in FIG. 2, in some embodiments, output impedance $Z_{OUT}$ of buffer 200 may be given by $$Z_{OUT} = 2\left(R_{TERM} + \frac{1}{gm}\right). \quad (4)$$

In some embodiments in which $$\frac{1}{gm}$$

is substantially smaller than $R_{TERM}$, the output impedance $Z_{OUT}$ of driver 200 may be given mainly by resistors 218 and 220, e.g., as $$Z_{OUT} = 2(R_{TERM}) \quad (5)$$

as the term $$\frac{1}{gm}$$

may be negligible.

In some embodiments, by disposing resistors 218 and 220 between the current path of transistors 202 and 210, and between the current path of transistors 204 and 212, respectively, the output signal swing is advantageously enhanced when compared with an implementation in which the termination resistances are disposed between nodes $N_1$ and terminal 242, and node $N_2$ and terminal 244, respectively (where the current path of transistor 202 is directly connected to the current path of transistor 210 and where the current path of transistor 204 is directly connected to the current path of transistor 212).

In some embodiments, power reduction may be achieved by reducing the termination resistance $R_{TERM}$ of resistors 218 and 220 and increasing the $$\frac{1}{gm}$$

value of transistors 202 and 204. For example, in some embodiments, the $$\frac{1}{gm}$$

value is not substantially smaller than resistance $R_{TERM}$. For example, in some embodiments, the $$\frac{1}{gm}$$

value is comparable to resistance $R_{TERM}$. For example, in some embodiments, the value $$\frac{1}{gm}$$

may be between 40% and 60% of $Z_{OUT}/2$ (such as 50% of $Z_{OUT}/2$). Other values, such as a value of $$\frac{1}{gm}$$

between 25% and 75% of $Z_{OUT}/2$ may also be possible. In some embodiments, the ratio between $$\frac{1}{gm}$$

and $R_{TERM}$ is determined based on the tradeoff between desirable power consumption and desirable THD. For example, in some embodiments, the higher the desired THD, the lower the $$\frac{1}{gm};$$

and the lower the desired power consumption, the higher the $$\frac{1}{gm}.$$

In embodiments in which the $$\frac{1}{gm}$$

value is comparable to resistance $R_{TERM}$, $V_{OUT}$ may be given by Equation 1 and $Z_{OUT}$ may be given by Equation 4. In some embodiments in which $I_{bias}$ is generated with a PTAT current, the value $$\frac{1}{gm}$$

may not vary over temperature. Thus, in some embodiments, the variation of the output impedance $Z_{OUT}$ over temperature may be advantageously reduced by having the value $$\frac{1}{gm}$$

comparable with $R_{TERM}$. For example, in an embodiment in which the value $$\frac{1}{gm}$$

is equal to $R_{TERM}$, and the variation over temperature of $R_{TERM}$ is 15%, the variation of $Z_{OUT}$ may be reduced from 15% (e.g., when the value $$\frac{1}{gm}$$

is substantially lower than $R_{TERM}$) to 7.5% (when the value $$\frac{1}{gm}$$

is equal to $R_{TERM}$).

In an embodiment in which $$R_{TERM} = \frac{R_{in}}{4}, R_{DEG} = \frac{3R_{TERM}}{2}, \text{ and } \frac{1}{gm} = R_{TERM},$$

output voltage $V_{OUT}$ may be given (e.g., based on Equation 1) as $$V_{OUT} = V_{IN} \cdot \left[ \frac{\frac{4R_{TERM}}{2}}{\frac{4R_{TERM}}{2} + R_{TERM}} + \frac{\frac{1}{R_{TERM}} \cdot \left[ \frac{\frac{4R_{TERM}}{2} \cdot (R_{TERM} + R_{TERM})}{\frac{4R_{TERM}}{2} + (R_{TERM} + R_{TERM})} \right]}{1 + \frac{1}{R_{TERM}} \cdot \frac{3R_{TERM}}{2}} \right] = \frac{16}{15}V_{in} \approx V_{IN}, \quad (6)$$

In an embodiment in which $$R_{TERM} = \frac{R_{in}}{4}, R_{DEG} = \frac{3R_{TERM}}{2}, \text{ and } \frac{1}{gm} = R_{TERM}$$

(e.g., associated with Equation 6), current $I_{bias}$ of current sources 232 and 234 may be 67% of the current $I_{bias}$ when $$R_{TERM} = \frac{R_{in}}{2}, R_{DEG} = R_{TERM}, \text{ and } \frac{1}{gm} \ll R_{TERM}$$

(e.g., associated with Equation 3) while achieving a similar (e.g., identical) output swing and linearity.

Advantages of some embodiments include achieving good linearity (low distortion) while keeping the power consumption of the reader 104 low (e.g., below 250 mW, such as below 100 mW, or below 50 mW, for example).

In some embodiments, a differential buffer has programmable output impedance. In some embodiments, a register bit or bits (e.g., of HDD preamplifier reader block 104) selects among a plurality of output impedances for the differential buffer.

Figure 3:
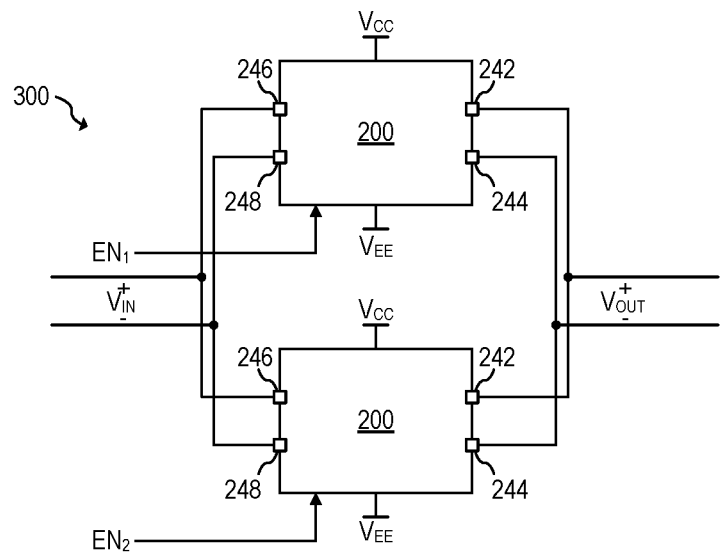

FIG. 3 shows a schematic diagram of buffer 300, according to an embodiment of the present invention. Buffer 114 may be implemented as buffer 300.

As shown in FIG. 3, buffer 300 includes two buffers 200 in parallel. Each of the buffers 200 may be selectably enabled or disabled based on respective enable signals EN1 and EN2. In some embodiments, one of the buffers 200 may be designed (e.g., based on the selection of $R_{TERM}$ and $\frac{1}{gm}$) to have a first output impedance $Z_{OUT\_1}$ (e.g., 50Ω) and the other of the buffers 200 may be designed to have a second output impedance $Z_{OUT\_2}$ (e.g., 100Ω). Thus, in some embodiments, buffer 300 may be configured to operate with the first output impedance $Z_{OUT\_1}$ by asserting signal EN1 (to enable the one buffer 200) and deasserting signal EN2 (to disable the other buffer 200) and may be configured to operate with the second output impedance $Z_{OUT\_2}$ by asserting signal EN2 and deasserting signal EN1.

In some embodiments, signals EN1 and EN2 may be provided by respective register bits (e.g., of HDD preamplifier reader block 104).

Figure 4:
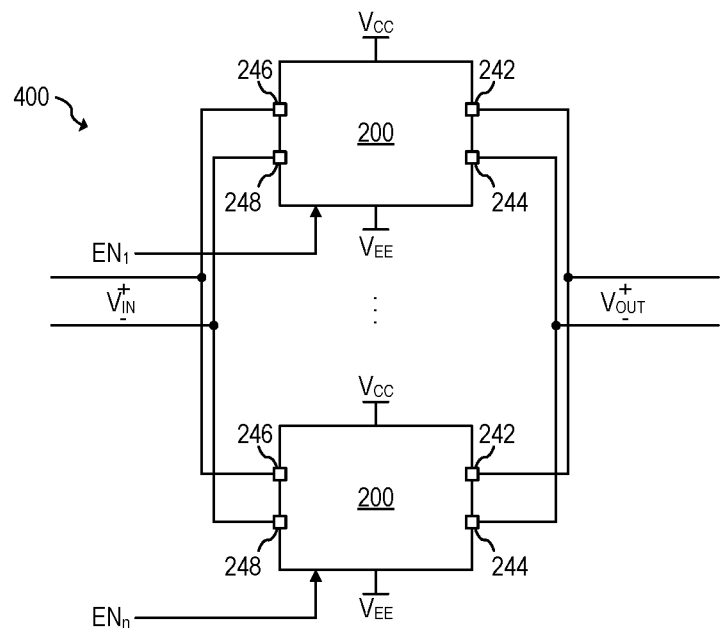

Although FIG. 3 illustrates an embodiment with two different programmable output impedances, some embodiments may allow for n different programmable output impedances (e.g., by connecting in parallel n buffers 200, e.g., as shown in FIG. 4).

By having a programmable output impedance, some embodiments advantageously allow for the using of the same buffer design for different output impedance requirements, thereby allowing a user to use the same buffer model for different platforms/products. In some embodiments, the output impedance of the buffer may be changed dynamically. For example, in some embodiments, the output impedance of the buffer may be changed dynamically during characterization/testing of a product, e.g., to identify the setting with the best performance.

Figure 5A:
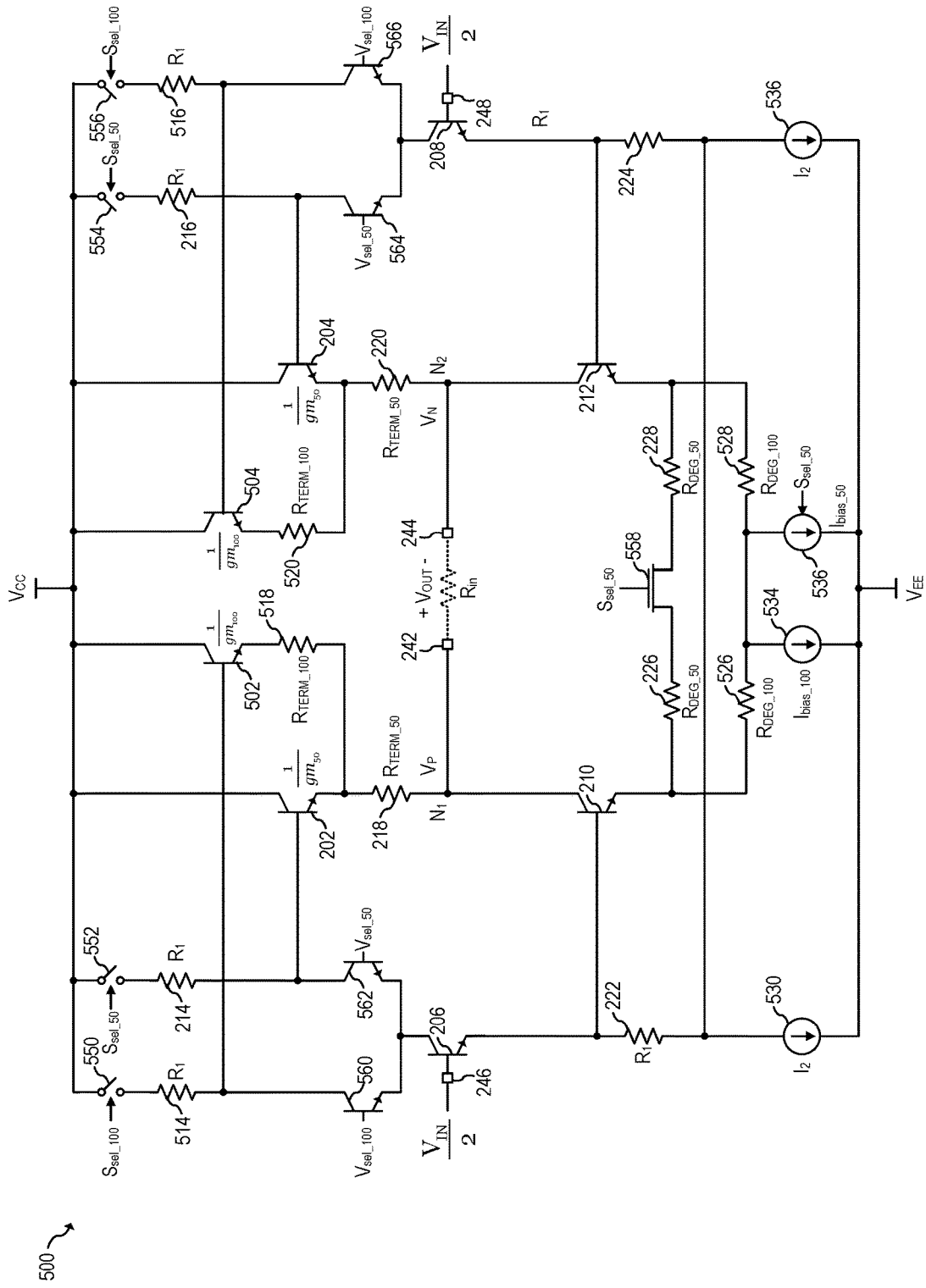
FIG. 5A show schematic diagrams of a buffer, according to embodiments of the present invention.

FIG. 5A shows a schematic diagram of buffer 500, according to an embodiment of the present invention. Buffer 500 includes BJTs 202, 204, 206, 208, 210, 212, 56o, 562, 564, and 566, metal-oxide semiconductor field-effect transistor (MOSFET) 558, resistors 214, 216, 218, 220, 222, 224, 226, 228, 502, 504, 514, 516, 518, 520, 526, and 528, switches 550, 552, 554, and 556, and current sources 530, 532, 534, and 236. Buffer 114 may be implemented as buffer 500.

Buffer 500 operates in a similar manner as buffer 200. Buffer 500, however, has programmable output impedance. For example, buffer 500 may exhibit a first or second output impedance based on the state of signals $S_{sel\_50}$ and $S_{sel\_100}$ and voltages $V_{sel\_50}$ and $V_{sel\_100}$.

Figure 5B:
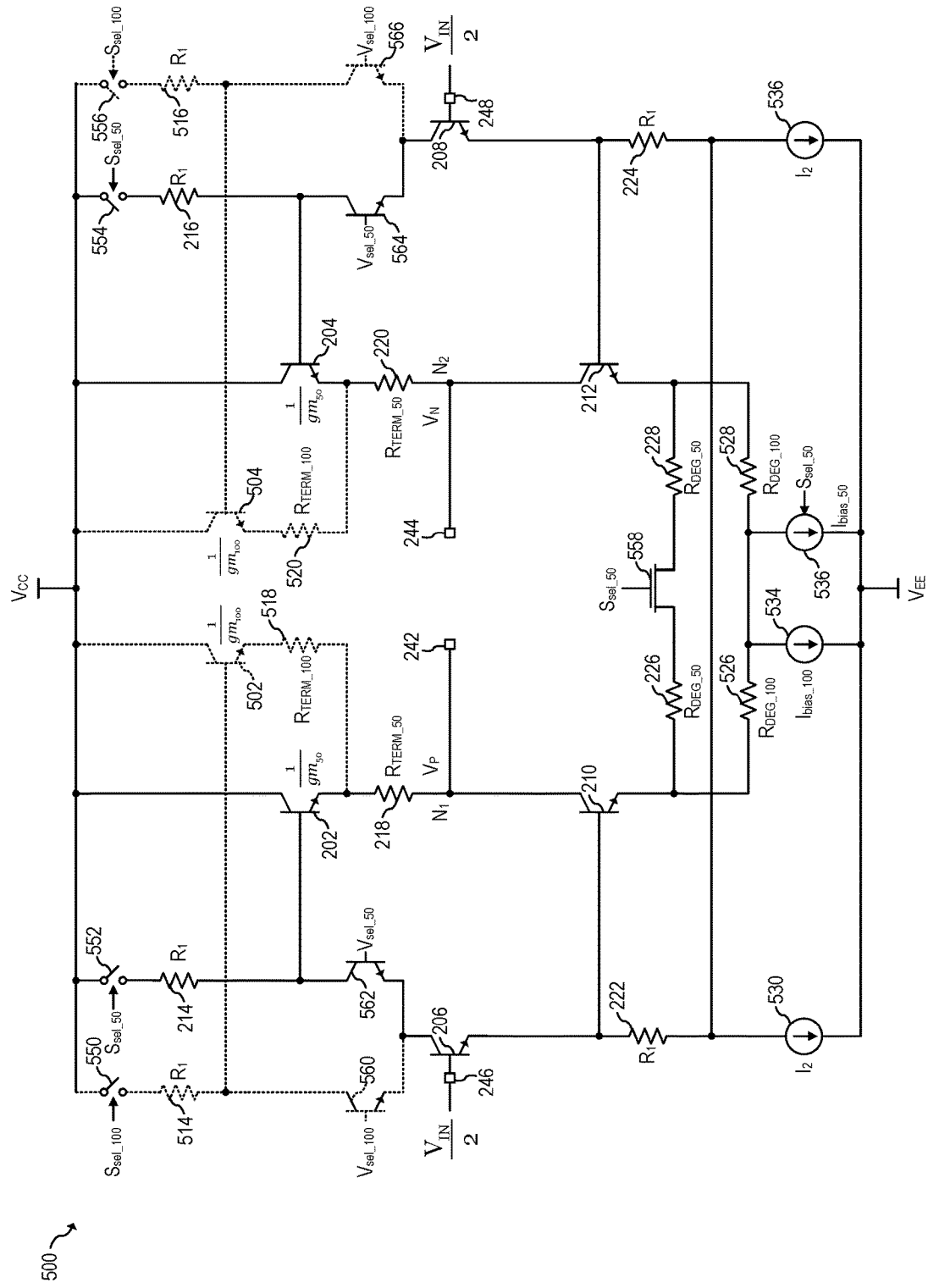
FIG. 5B illustrates the buffer of FIG. 5A operating with the first output impedance, according to an embodiment of the present invention.

The first output impedance (e.g., 50Ω) may be selected by asserting (e.g., high) signal $S_{sel\_50}$, deasserting (e.g., low) signal $S_{sel\_100}$, increasing voltage $V_{sel\_50}$ to a high predetermined voltage and decreasing voltage $V_{sel\_100}$ to a low predetermined voltage. Thus, when the first output impedance is selected, switches 552 and 554 are closed, switches 550 and 556 are open, transistor 558 is on, transistors 562 and 564 are bias to be on, transistors 560 and 566 are biased to be off, current source 536 is on. FIG. 5B illustrates buffer 500 operating with the first output impedance, according to an embodiment of the present invention.

FIG. 5B illustrates with dotted lines circuit path that are off when the first output impedance is selected. As shown in FIG. 5B, when the first output impedance is selected, resistors 518 and 520 may be ignored and the value $R_{TERM}$ as used in Equations 1, 2, 4, and 5 may be given by $$R_{TERM}=R_{TERM\_50}. \quad (7)$$

Since transistor 558 is on, the value $R_{DEG}$ as used in Equations 1, 2, 4, and 5 may be given by $$R_{DEG} = \frac{R_{DEG\_50} \cdot R_{DEG\_100}}{R_{DEG\_50} + R_{DEG\_100}}. \quad (8)$$

Since transistors 502, 504, 560, and 566 are off, the value gm as used in Equations 1, 2, 4, and 5 may be given by $$gm=gm_{50}. \quad (9)$$

Since current source 534 is on, current $I_{bias}$ for biasing the output stage of buffer 500 may be given by $$I_{bias}=I_{bias\_50}+I_{bias\_100}. \quad (10)$$

Figure 5C:
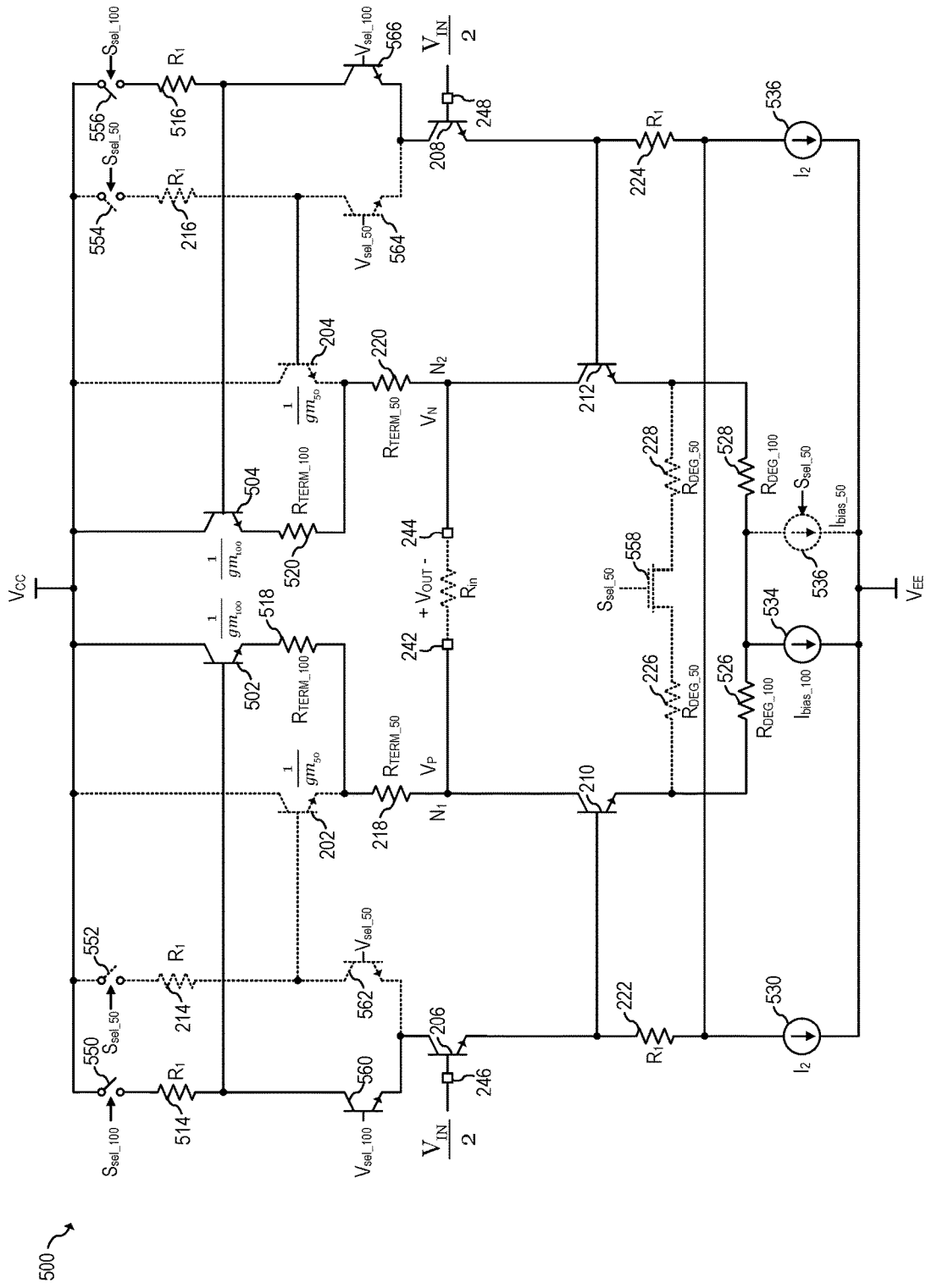
FIG. 5C illustrates the buffer of FIG. 5A operating with the second output impedance, according to an embodiment of the present invention.

The second output impedance (e.g., 100Ω) may be selected by asserting (e.g., high) signal $S_{sel\_100}$, deasserting (e.g., low) signal $S_{sel\_50}$, increasing voltage $V_{sel\_100}$ to a high predetermined voltage and decreasing voltage $V_{sel\_50}$ to a low predetermined voltage. Thus, when the second output impedance is selected, switches 550 and 560 are closed, switches 552 and 554 are open, transistor 558 is off, transistors 562 and 564 are bias to be off, transistors 560 and 566 are biased to be on, and current source 536 is off. FIG. 5C illustrates buffer 500 operating with the second output impedance, according to an embodiment of the present invention.

FIG. 5C illustrates with dotted lines circuit path that are off when the second output impedance is selected. As shown in FIG. 5C, when the second output impedance is selected, resistors 518 and 520 are in series with resistors 218 and 220, respectively, and the value $R_{TERM}$ as used in Equations 1, 2, 4, and 5 may be given by $$R_{TERM}=R_{TERM\_50}+R_{TERM\_100}. \quad (11)$$

Since transistor 558 is off, the value $R_{DEG}$ as used in Equations 1, 2, 4, and 5 may be given by $$R_{DEG}=R_{DEG\_100}. \quad (12)$$

Since transistors 202, 204, 562, and 564 are off, the value gm as used in Equations 1, 2, 4, and 5 may be given by $$gm=gm_{100}. \quad (13)$$

Since current source 534 is off, current $I_{bias}$ for biasing the output stage of buffer 500 may be given by $$I_{bias}=I_{bias\_100}. \quad (14)$$

In some embodiments, the values of $R_{DEG\_50}$, $R_{DEG\_100}$, $R_{TERM\_50}$, $R_{TERM\_100}$, $I_{bias\_50}$, $I_{bias\_100}$, $gm_{50}$ and $gm_{100}$ may be selected so as to produce a desired first output impedance, output voltage swing, linearity, and power consumption when the first output impedance is selected, and to produce a desired second output impedance, output voltage swing, linearity, and power consumption when the second output impedance is selected, e.g., based on Equations 1, 2, 4, 5, and 7-14. For example, in an embodiment in which the first and second output impedances are 50Ω and 100Ω, respective, current $I_{bias}$ may be twice as high when the first output impedance is selected versus when the second output impedance is selected (e.g., $I_{bias\_50}$ equal to $I_{bias\_100}$) e.g., to keep the same output swing independent of which output impedance (e.g., first or second) is selected, $R_{DEG\_50}$ may be equal to $R_{DEG\_100}$, and $$\frac{1}{gm_{100}}$$

may be twice $$\frac{1}{gm_{50}},$$

and $R_{TERM\_100}$ may be equal to $R_{TERM\_50}$.

In some embodiments, the first and second output impedances may be 50Ω and 100Ω, respective. In some embodiments, other impedance values may also be used.

In some embodiments, transistor 558 is an n-type transistor that operates as a switch to connect resistors 226 and 228 based on signal $S_{sel\_50}$ (e.g., to change the gain of the output stage and cause the gain of buffer 500 constant between the first and second output impedance selection). In some embodiments, transistor 558 may be implemented with a p-type transistor (e.g., by using $\overline{S_{sel\_50}}$ to control transistor 558). Other implementations, such as using other type of transistors, are also possible.

As shown in FIG. 5A, buffer 500 advantageously has programmable output impedance with lower area than buffer 300.

As shown in FIG. 5A, in some embodiments, current source 534 is on for both output impedance selection. In some embodiments, current source 534 may be controlled, e.g., by signal $S_{sel\_100}$ and is turned off when the first output impedance is selected and turned on when the second output impedance is selected. In some embodiments, current sources 534 and 536 may be combined into a single programmable current source that adjusts the generated current to $I_{bias\_100}$ or $I_{bias\_50}$ based on signals $S_{sel\_50}$ and or $S_{sel\_100}$. Other implementations are also possible.

Figure 5D:
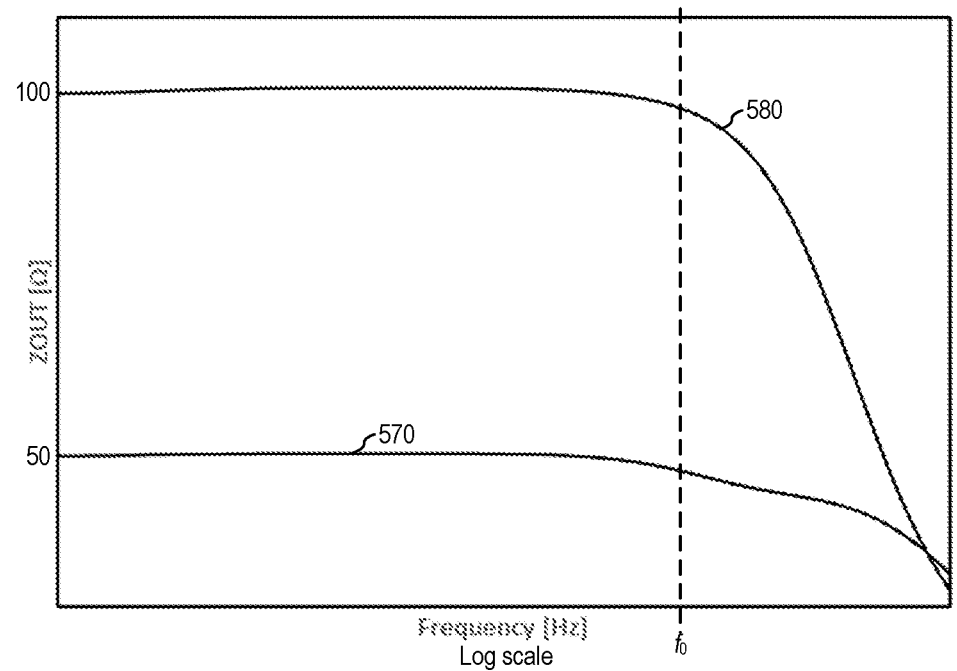
FIGS. 5D and 5E show simulation graphs for output impedance and gain, respectively, of the buffer of FIG. 5A, according to an embodiment of the present invention.
Figure 5E:
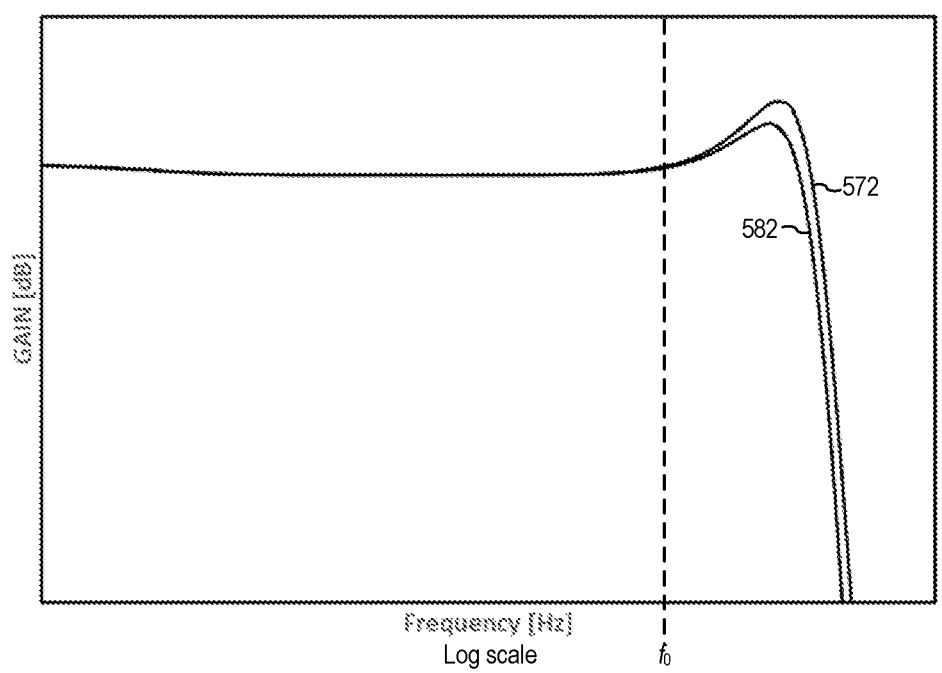

FIGS. 5D and 5E show simulation graphs for output impedance and gain, respectively, of buffer 500, when the first and second output impedances are 50Ω and 100Ω, respectively, according to an embodiment of the present invention. Curves 570 and 572 show the output impedance and gain, respectively, for the 50Ω output impedance. Curves 580 and 582 show the output impedance and gain, respectively, for the 100Ω output impedance.

As shown by FIGS. 5D and 5E, selecting between the first and second output impedances does not substantially affect gain of buffer 500. For example, in some embodiments, the gain of buffer 500 is substantially identical for most or all of the operating frequency of buffer 500 (e.g., for frequencies lower than $f_o$). In some embodiments, frequency $f_o$ may be between 4 GHz and 5 GHz. In some embodiments, $f_o$ may be higher than 5 GHz (e.g., 5.5 GHz, or higher) or lower than 4 GHz (e.g., 3 GHz or lower).

Advantages of some embodiments include achieving a programmable output impedance with high speed, low-power, and low distortion, where the output impedance is relatively stable versus process and temperature variation.

Figure 6:
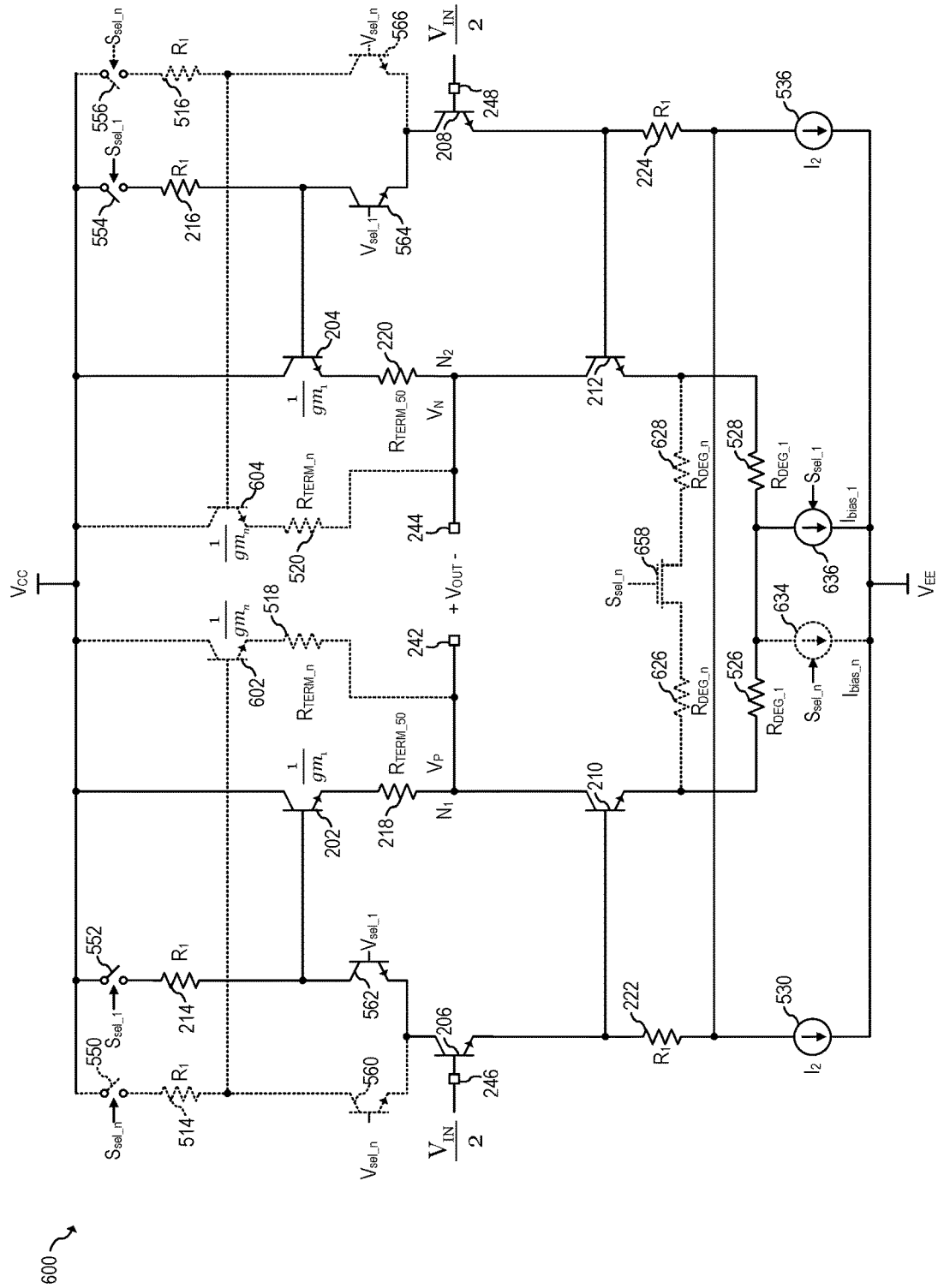
FIGS. 6 and 7 show schematic diagrams of buffers, according to embodiments of the present invention.

Although FIG. 5A illustrates an embodiment with two different programmable output impedances, some embodiments may allow for n different programmable output impedances, where n is equal to or higher than 2, e.g., as shown in FIG. 6. For example, FIG. 6 shows a schematic diagram of buffer 600, according to an embodiment of the present invention. Buffer 114 may be implemented as buffer 600.

Buffer 600 operates in a similar manner as buffer 500. Buffer 600, however, has n programmable output impedances. In some embodiments, to achieve n programmable output impedances, buffer 600 replicates the dotted line circuit and circuit path illustrated in FIG. 6 n−1 times. In the circuit illustrated in FIG. 6, n is equal to 2.

For example, the first output impedance of buffer 600 may be selected by asserting (e.g., high) signal $S_{sel\_1}$, deasserting (e.g., low) all other signals $S_{sel\_2}$ to $S_{sel\_n}$, increasing voltage $V_{sel\_1}$ to a high predetermined voltage and decreasing all other voltages $V_{sel\_2}$ to $V_{sel\_n}$ to a low predetermined voltage.

In some embodiments, Equations 1, 2, 4, and 5 apply to buffer 600 and may be used for each of the n programmable output impedances. Thus, in some embodiments, the values of $R_{DEG\_i}$, $R_{TERM\_i}$, $I_{bias\_50}$, $I_{bias\_i}$, and $gm_i$ may be selected so as to produce a desired output impedance, output voltage swing, linearity, and power consumption when the ith output impedance is selected, where i is a number between 1 and n.

Figure 7:
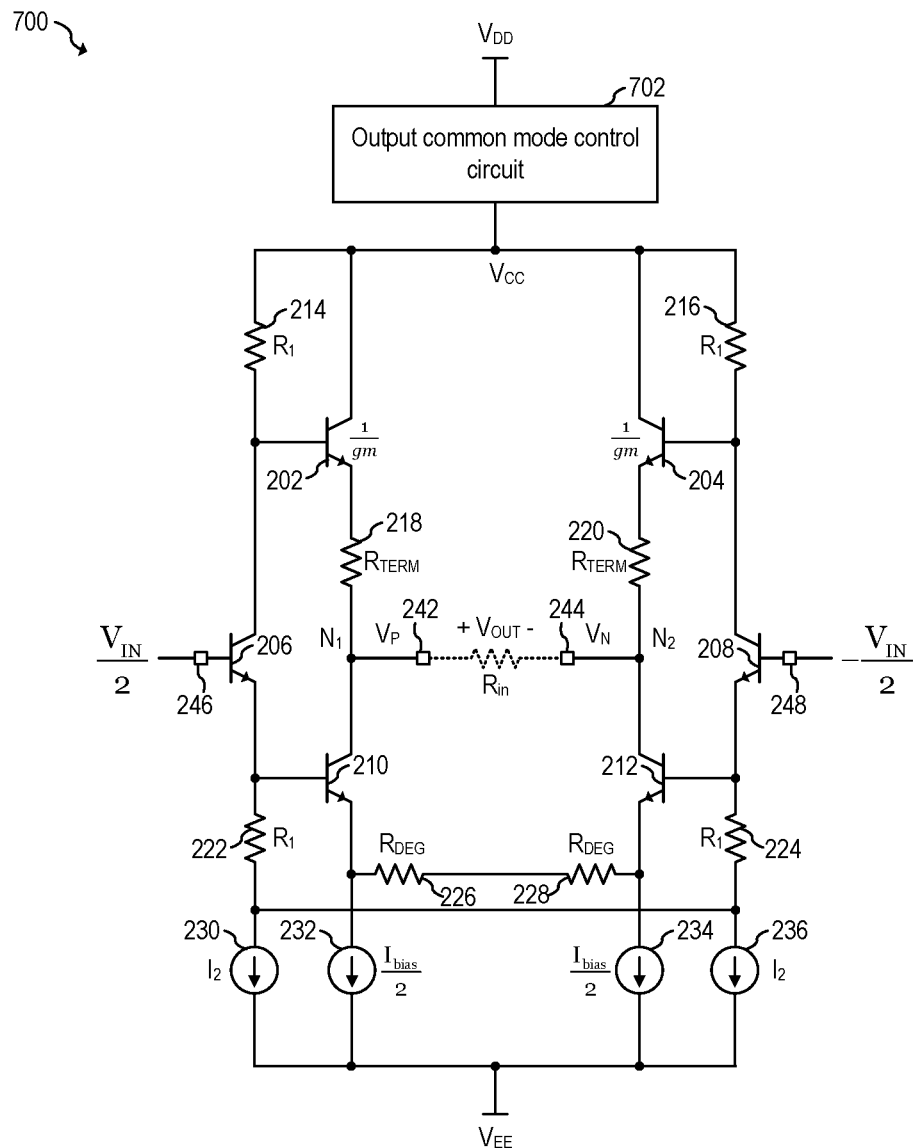

In some embodiments, maintaining a controlled output voltage common mode may be desirable, e.g., to be compatible with scaled CMOS technology (e.g., 40 nm, 28 nm, and lower) of SoC 108. For example, in some embodiments, the common mode at the output terminals 242 and 244 may be approximately 1V. FIG. 7 shows a schematic diagram of buffer 700, according to an embodiment of the present invention. Buffer 114 may be implemented as buffer 700.

Figure 8:
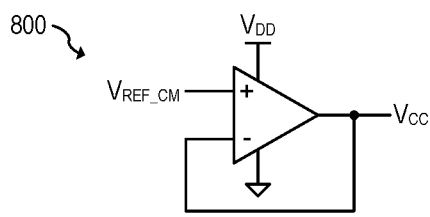
FIGS. 8 and 9 show schematic diagrams of output common mode control circuits, according to embodiments of the present invention.
Figure 9:
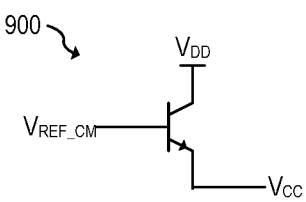

Buffer 700 operates in a similar manner as buffer 200. Buffer 700, however, includes output common mode control circuit 702 for supply voltage $V_{CC}$. In some embodiments, output common mode control circuit 702 may be used to set the output common mode at terminals 242 and 244 to a desired value. In some embodiments, if a fast turn-on time is desired, an open loop architecture may be implemented. In some embodiments, if an accurate voltage $V_{CC}$ is desired, a closed-loop architecture may be used. FIGS. 8 and 9 show schematic diagrams of output common mode control circuits 800 and 900, respectively, according to embodiments of the present invention. Output common mode control circuit 702 may be implemented as output common mode control circuits 800 (with a closed-loop architecture) or output common mode control circuits 900 (with an open-loop architecture).

In some embodiments, output common mode control circuit 900 may achieve a settling time of the output common mode voltage at terminals 242 and 244 lower than 20 ns.

AS shown in FIGS. 8 and 9, the supply voltage $V_{CC}$ (and thus, the common mode voltage at terminals 242 and 244) may be controlled based on reference voltage $V_{REF\_CM}$.

As shown in FIG. 7, output common mode control circuit 702 may be used to generate supply voltage $V_{CC}$ for buffer 200. In some embodiments, output common mode control circuit 702 may be used to generate supply voltage $V_{CC}$ for buffers 300, 400, 500, and 600.

In some embodiments in which the buffer has programmable output impedance (e.g., buffers 300, 400, 500, and 600), a register bit or bits (e.g., of reader 104) may be used to select control the values of the output impedance (e.g., to control signals $S_{sel\_i}$, $V_{sel\_i}$) as well the value of $V_{REF\_CM}$. For example, in an embodiment in which output common mode control circuit 900 supplies supply voltage $V_{CC}$ for buffer 500, a single register bit ($BIT_{sel}$) may be used to set $S_{sel\_50}$, $S_{sel\_100}$, $V_{sel\_50}$, $V_{sel\_100}$, and VREF_CM. For example, in an embodiment, when $BIT_{sel}$ is equal to zero, the first output impedance is selected (e.g., by asserting signal $S_{sel\_50}$, deasserting signal $S_{sel\_100}$, increasing voltage $V_{sel\_50}$ to the high predetermined voltage and decreasing voltage $V_{sel\_100}$ to the low predetermined voltage) and $V_{REF\_CM}$ is set to a first predetermined voltage to cause the output common mode at terminals 242 and 244 to be set to a target voltage accounting for the states of signals $S_{sel\_50}$, $S_{sel\_100}$, $V_{sel\_50}$, and $V_{sel\_100}$ when the first output impedance is selected. When $BIT_{sel}$ is equal to 1, the second output impedance is selected (e.g., by asserting signal $S_{sel\_100}$, deasserting signal $S_{sel\_50}$, increasing voltage $V_{sel\_100}$ to the high predetermined voltage and decreasing voltage $V_{sel\_50}$ to the low predetermined voltage) and $V_{REF\_CM}$ is set to a second predetermined voltage (different from the first predetermined voltage) to cause the output common mode at terminals 242 and 244 to be set to the target voltage accounting for the states of signals $S_{sel\_50}$, $S_{sel\_100}$, $V_{sel\_50}$, and $V_{sel\_100}$ when the second output impedance is selected.

Example embodiments of the present invention are summarized here. Other embodiments can also be understood from the entirety of the specification and the claims filed herein.

Example 1. An electronic circuit including: first and second input terminals configured to receive a differential input voltage; first and second output terminals configured to provide a differential output voltage based on the differential input voltage; a first supply terminal configured to receive a first supply voltage; an input differential pair including: a first transistor having a control terminal coupled to the first input terminal, and a first current path terminal coupled to the first supply terminal, and a second transistor having a control terminal coupled to the second input terminal, and a first current path terminal coupled to the first supply terminal; a first pair of transistors in emitter-follower configuration including: a third transistor having a control terminal coupled to the first current path terminal of the first transistor, a first current path terminal coupled to the first supply terminal, and a second current path terminal coupled to the first output terminal, and a fourth transistor having a control terminal coupled to the first current path terminal of the second transistor, a first current path terminal coupled to the first supply terminal, and a second current path terminal coupled to the second output terminal; an output differential pair including: a fifth transistor having a control terminal coupled to a second current path terminal of the first transistor, and a first current path terminal coupled to the first output terminal, and a sixth transistor having a control terminal coupled to a second current path terminal of the second transistor, and a first current path terminal coupled to the second output terminal; a first termination resistor coupled between the second current path terminal of the third transistor and the first current path terminal of the fifth transistor; and a second termination resistor coupled between the second current path terminal of the fourth transistor and the first current path terminal of the sixth transistor.

Example 2. The electronic circuit of example 1, further including a first degeneration resistor coupled between a second current path terminal of the fifth transistor and a second current path terminal of the sixth transistor.

Example 3. The electronic circuit of one of examples 1 or 2, further including a second degeneration resistor coupled between the first degeneration resistor and the second current path terminal of the sixth transistor.

Example 4. The electronic circuit of one of examples 1 to 3, where a termination resistance of the first termination resistor is equal to a degeneration resistance of the first degeneration resistor.

Example 5. The electronic circuit of one of examples 1 to 4, where a termination resistance of the first termination resistor is smaller than a degeneration resistance of the first degeneration resistor.

Example 6. The electronic circuit of one of examples 1 to 5, where the electronic circuit has a unity gain between the first and second input terminals and the first and second output terminals.

Example 7. The electronic circuit of one of examples 1 to 6, where the third transistor has a first transconductance, and where 1 divided by the first transconductance is 10 times lower than a termination resistance of the first termination resistor or lower.

Example 8. The electronic circuit of one of examples 1 to 7, where the electronic circuit has an output impedance at the first and second output terminal, where the third transistor has a first transconductance, and where 2 divided by the first transconductance is between 40% and 60% of the output impedance.

Example 9. The electronic circuit of one of examples 1 to 8, where 1 divided by the first transconductance is equal to a termination resistance of the first termination resistor.

Example 10. The electronic circuit of one of examples 1 to 9, further including a second pair of transistors in emitter-follower configuration including: a seventh transistor having a control terminal coupled to the first current path terminal of the first transistor, a first current path terminal coupled to the first supply terminal, and a second current path terminal coupled to the first output terminal; and an eighth transistor having a control terminal coupled to the first current path terminal of the second transistor, a first current path terminal coupled to the first supply terminal, and a second current path terminal coupled to the second output terminal, where the electronic circuit further includes: a third termination resistor coupled between the second current path terminal of the seventh transistor and the first current path terminal of the fifth transistor, and a fourth termination resistor coupled between the second current path terminal of the eighth transistor and the first current path terminal of the sixth transistor.

Example 11. The electronic circuit of one of examples 1 to 10, where the third termination resistor is couple between the first termination resistor and the second current path terminal of the seventh transistor, and where the fourth termination resistor is couple between the second termination resistor and the second current path terminal of the eighth transistor.

Example 12. The electronic circuit of one of examples 1 to 11, where the electronic circuit is configured to: select a first output impedance at the first and second output terminal by turning off the seventh and eighth transistors and turning on the third and fourth transistors; and select a second output impedance at the first and second output terminal by turning on the seventh and eighth transistors and turning off the third and fourth transistors.

Example 13. The electronic circuit of one of examples 1 to 12, where the electronic circuit has a first gain between the first and second input terminals and the first and second output terminals when the first output impedance is selected, where the electronic circuit has a second gain between the first and second input terminals and the first and second output terminals when the second output impedance is selected, and where the first gain is substantially equal to the second gain.

Example 14. The electronic circuit of one of examples 1 to 13, further including: a first degeneration resistor coupled between a second current path terminal of the fifth transistor and a second current path terminal of the sixth transistor; a second degeneration resistor coupled between the first degeneration resistor and the second current path terminal of the sixth transistor; and a first switch coupled between the first and second degeneration resistors, where selecting the first output impedance further includes closing the first switch, and where selecting the second output impedance further includes opening the first switch.

Example 15. The electronic circuit of one of examples 1 to 14, where the first switch includes a metal-oxide semiconductor field-effect transistor (MOSFET), where the electronic circuit is configured to close the first switch by turning on the MOSFET, and open the first switch by turning off the MOSFET.

Example 16. The electronic circuit of one of examples 1 to 15, further including: a fifth resistor coupled to the control terminal of the third transistor; a sixth resistor coupled to the control terminal of the fourth transistor; a seventh resistor coupled to the control terminal of the seventh transistor; an eighth resistor coupled to the control terminal of the eighth transistor; a first switch coupled between the fifth resistor and the first supply terminal; a second switch coupled between the sixth resistor and the first supply terminal; a third switch coupled between the seventh resistor and the first supply terminal; a fourth switch coupled between the eighth resistor and the first supply terminal; a third pair of transistors including: a ninth transistor having a current path coupled between the fifth resistor and the first current path terminal of the first transistor, where a first intermediate node between the fifth resistor and the current path of the ninth transistor is coupled to the control terminal of the third transistor, and a tenth transistor having a current path coupled between the seventh resistor and the first current path terminal of the first transistor, where a second intermediate node between the seventh resistor and the current path of the tenth transistor is coupled to the control terminal of the seventh transistor; and a fourth pair of transistors including: an eleventh transistor having a current path coupled between the sixth resistor and the first current path terminal of the second transistor, where a third intermediate node between the sixth resistor and the current path of the eleventh transistor is coupled to the control terminal of the fourth transistor, and a twelfth transistor having a current path coupled between the eighth resistor and the first current path terminal of the second transistor, where a fourth intermediate node between the eighth resistor and the current path of the twelfth transistor is coupled to the control terminal of the eighth transistor, where selecting the first output impedance further includes turning on the ninth and eleventh transistors, turning off the tenth and twelfth transistors, closing the first and second switches, and opening the third and fourth switches, and where selecting the second output impedance further includes turning off the ninth and eleventh transistors, turning on the tenth and twelfth transistors, opening the first and second switches, and closing the third and fourth switches.

Example 17. The electronic circuit of one of examples 1 to 16, further including an output common mode control circuit configured to supply the first supply voltage based on a reference voltage, where selecting the first output impedance further includes setting the reference voltage to a first voltage, and where selecting the second output impedance further includes setting the reference voltage to a second voltage different from the first voltage.

Example 18. The electronic circuit of one of examples 1 to 17, further including a second supply terminal configured to receive a second supply voltage that is lower than the first supply voltage, where the second current path terminals of the first, second, fifth, and sixth transistors are coupled to the second supply terminal.

Example 19. The electronic circuit of one of examples 1 to 18, where the first, second, third, fourth, fifth, and sixth transistors are bipolar junction transistors (BJTs).

Example 20. The electronic circuit of one of examples 1 to 19, where the first, second, third, fourth, fifth, and sixth transistors are transistors of the n-type.

Example 21. The electronic circuit of one of examples 1 to 20, further including: a further circuit; a first transmission line coupled between a first input of the further circuit and the first output terminal; and a second transmission line coupled between a second input of the further circuit and the second output terminal.

Example 22. The electronic circuit of one of examples 1 to 21, further including a first current source coupled to the second current path terminal of the fifth transistor, the first current source configured to generate a first reference current based on a PTAT current.

Example 23. The electronic circuit of one of examples 1 to 22, where the electronic circuit is a hard-disk drive (HDD) preamplifier circuit further including a low-noise amplifier having an input configured to be coupled to a magnetoresistance (MR) sensor, and a variable gain amplifier having an input coupled to an output of the low-noise amplifier and first and second outputs respectively coupled to the first and second input terminals, where the electronic circuit is configured to read data from a magnetic disk using the MR sensor.

Example 24. A method including: receiving a first supply voltage at a first supply terminal; receiving a differential input voltage between first and second input terminals with an input differential pair including: a first transistor having a control terminal coupled to the first input terminal, and a first current path terminal coupled to the first supply terminal, and a second transistor having a control terminal coupled to the second input terminal, and a first current path terminal coupled to the first supply terminal; generating a differential output voltage between first and second output terminals based on the differential input voltage by using a first pair of transistors in emitter-follower configuration, and an output differential pair; where the first pair of transistors includes: a third transistor having a control terminal coupled to the first current path terminal of the first transistor, a first current path terminal coupled to the first supply terminal, and a second current path terminal coupled to the first output terminal, and a fourth transistor having a control terminal coupled to the first current path terminal of the second transistor, a first current path terminal coupled to the first supply terminal, and a second current path terminal coupled to the second output terminal; where the output differential pair includes: a fifth transistor having a control terminal coupled to a second current path terminal of the first transistor, and a first current path terminal coupled to the first output terminal, and a sixth transistor having a control terminal coupled to a second current path terminal of the second transistor, and a first current path terminal coupled to the second output terminal; where a first termination resistor is coupled between the second current path terminal of the third transistor and the first current path terminal of the fifth transistor; and where a second termination resistor is coupled between the second current path terminal of the fourth transistor and the first current path terminal of the sixth transistor.

Example 25. The method of example 24, further including: selecting a first output impedance at the first and second output terminal by turning off seventh and eighth transistors and turning on the third and fourth transistors, where the seventh transistor includes a control terminal coupled to the first current path terminal of the first transistor, a first current path terminal coupled to the first supply terminal, and a second current path terminal coupled to the first output terminal, where the eighth transistor includes a control terminal coupled to the first current path terminal of the second transistor, a first current path terminal coupled to the first supply terminal, and a second current path terminal coupled to the second output terminal, where a third termination resistor is coupled between the second current path terminal of the seventh transistor and the first current path terminal of the fifth transistor, and where a fourth termination resistor is coupled between the second current path terminal of the eighth transistor and the first current path terminal of the sixth transistor; or selecting a second output impedance at the first and second output terminal by turning on the seventh and eighth transistors and turning off the third and fourth transistors.

Example 26. The method of one of examples 24 or 25, where the selecting the first or second output impedance includes using a register bit.

Example 27. The method of one of examples 24 to 26, further including, selecting the first output impedance, and, after selecting the first output impedance, selecting the second output impedance.

Example 28. The method of one of examples 24 to 27, where a frequency of the differential input voltage is higher than 4 GHz.

Example 29. A differential driver including: first and second input terminals configured to receive a differential input voltage; first and second output terminals configured to provide a differential output voltage based on the differential input voltage; a first supply terminal configured to receive a first supply voltage; an input differential pair including: a first transistor having a control terminal coupled to the first input terminal, and a first current path terminal coupled to the first supply terminal, and a second transistor having a control terminal coupled to the second input terminal, and a first current path terminal coupled to the first supply terminal; a first pair of transistors in emitter-follower configuration including: a third transistor having a control terminal coupled to the first current path terminal of the first transistor, a first current path terminal coupled to the first supply terminal, and a second current path terminal coupled to the first output terminal, and a fourth transistor having a control terminal coupled to the first current path terminal of the second transistor, a first current path terminal coupled to the first supply terminal, and a second current path terminal coupled to the second output terminal; an output differential pair including: a fifth transistor having a control terminal coupled to a second current path terminal of the first transistor, and a first current path terminal coupled to the first output terminal, and a sixth transistor having a control terminal coupled to a second current path terminal of the second transistor, and a first current path terminal coupled to the second output terminal; a first termination resistor coupled between the second current path terminal of the third transistor and the first current path terminal of the fifth transistor; a second termination resistor coupled between the second current path terminal of the fourth transistor and the first current path terminal of the sixth transistor; a first degeneration resistor coupled between a second current path terminal of the fifth transistor and a second current path terminal of the sixth transistor; a second pair of transistors in emitter-follower configuration including: a seventh transistor having a control terminal coupled to the first current path terminal of the first transistor, a first current path terminal coupled to the first supply terminal, and a second current path terminal coupled to the first output terminal, and an eighth transistor having a control terminal coupled to the first current path terminal of the second transistor, a first current path terminal coupled to the first supply terminal, and a second current path terminal coupled to the second output terminal; a third termination resistor coupled between the second current path terminal of the seventh transistor and the first current path terminal of the fifth transistor; and a fourth termination resistor coupled between the second current path terminal of the eighth transistor and the first current path terminal of the sixth transistor.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:
1. An electronic circuit comprising:
 first and second input terminals configured to receive a differential input voltage;
 first and second output terminals configured to provide a differential output voltage based on the differential input voltage;
 a first supply terminal configured to receive a first supply voltage;
 an input differential pair comprising:
  a first transistor having a control terminal coupled to the first input terminal, and a first current path terminal coupled to the first supply terminal, and
  a second transistor having a control terminal coupled to the second input terminal, and a first current path terminal coupled to the first supply terminal;
 a first pair of transistors in emitter-follower configuration comprising:
  a third transistor having a control terminal coupled to the first current path terminal of the first transistor, a first current path terminal coupled to the first supply terminal, and a second current path terminal coupled to the first output terminal, and
  a fourth transistor having a control terminal coupled to the first current path terminal of the second transistor, a first current path terminal coupled to the first supply terminal, and a second current path terminal coupled to the second output terminal;
 an output differential pair comprising:
  a fifth transistor having a control terminal coupled to a second current path terminal of the first transistor, and a first current path terminal coupled to the first output terminal, and
  a sixth transistor having a control terminal coupled to a second current path terminal of the second transistor, and a first current path terminal coupled to the second output terminal;

a first termination resistor coupled between the second current path terminal of the third transistor and the first current path terminal of the fifth transistor; and a second termination resistor coupled between the second current path terminal of the fourth transistor and the first current path terminal of the sixth transistor.

2. The electronic circuit of claim 1, further comprising a first degeneration resistor coupled between a second current path terminal of the fifth transistor and a second current path terminal of the sixth transistor.

3. The electronic circuit of claim 2, further comprising a second degeneration resistor coupled between the first degeneration resistor and the second current path terminal of the sixth transistor.

4. The electronic circuit of claim 2, wherein a termination resistance of the first termination resistor is equal to a degeneration resistance of the first degeneration resistor.

5. The electronic circuit of claim 2, wherein a termination resistance of the first termination resistor is smaller than a degeneration resistance of the first degeneration resistor.

6. The electronic circuit of claim 1, wherein the electronic circuit has a unity gain between the first and second input terminals and the first and second output terminals.

7. The electronic circuit of claim 1, wherein the third transistor has a first transconductance, and wherein 1 divided by the first transconductance is 10 times lower than a termination resistance of the first termination resistor or lower.

8. The electronic circuit of claim 1, wherein the electronic circuit has an output impedance at the first and second output terminal, wherein the third transistor has a first transconductance, and wherein 2 divided by the first transconductance is between 40% and 60% of the output impedance.

9. The electronic circuit of claim 8, wherein 1 divided by the first transconductance is equal to a termination resistance of the first termination resistor.

10. The electronic circuit of claim 1, further comprising a second pair of transistors in emitter-follower configuration comprising:

a seventh transistor having a control terminal coupled to the first current path terminal of the first transistor, a first current path terminal coupled to the first supply terminal, and a second current path terminal coupled to the first output terminal; and an eighth transistor having a control terminal coupled to the first current path terminal of the second transistor, a first current path terminal coupled to the first supply terminal, and a second current path terminal coupled to the second output terminal, wherein the electronic circuit further comprises:

a third termination resistor coupled between the second current path terminal of the seventh transistor and the first current path terminal of the fifth transistor, and a fourth termination resistor coupled between the second current path terminal of the eighth transistor and the first current path terminal of the sixth transistor.

11. The electronic circuit of claim 10, wherein the third termination resistor is couple between the first termination resistor and the second current path terminal of the seventh transistor, and wherein the fourth termination resistor is couple between the second termination resistor and the second current path terminal of the eighth transistor.

12. The electronic circuit of claim 10, wherein the electronic circuit is configured to:

select a first output impedance at the first and second output terminal by turning off the seventh and eighth transistors and turning on the third and fourth transistors; and select a second output impedance at the first and second output terminal by turning on the seventh and eighth transistors and turning off the third and fourth transistors.

13. The electronic circuit of claim 12, wherein the electronic circuit has a first gain between the first and second input terminals and the first and second output terminals when the first output impedance is selected, wherein the electronic circuit has a second gain between the first and second input terminals and the first and second output terminals when the second output impedance is selected, and wherein the first gain is substantially equal to the second gain.

14. The electronic circuit of claim 12, further comprising:

a first degeneration resistor coupled between a second current path terminal of the fifth transistor and a second current path terminal of the sixth transistor;

a second degeneration resistor coupled between the first degeneration resistor and the second current path terminal of the sixth transistor; and a first switch coupled between the first and second degeneration resistors, wherein selecting the first output impedance further comprises closing the first switch, and wherein selecting the second output impedance further comprises opening the first switch.

15. The electronic circuit of claim 14, wherein the first switch comprises a metal-oxide semiconductor field-effect transistor (MOSFET), wherein the electronic circuit is configured to close the first switch by turning on the MOSFET, and open the first switch by turning off the MOSFET.

16. The electronic circuit of claim 12, further comprising:

a fifth resistor coupled to the control terminal of the third transistor;

a sixth resistor coupled to the control terminal of the fourth transistor;

a seventh resistor coupled to the control terminal of the seventh transistor;

an eighth resistor coupled to the control terminal of the eighth transistor;

a first switch coupled between the fifth resistor and the first supply terminal;

a second switch coupled between the sixth resistor and the first supply terminal;

a third switch coupled between the seventh resistor and the first supply terminal;

a fourth switch coupled between the eighth resistor and the first supply terminal;

a third pair of transistors comprising:

a ninth transistor having a current path coupled between the fifth resistor and the first current path terminal of the first transistor, wherein a first intermediate node between the fifth resistor and the current path of the ninth transistor is coupled to the control terminal of the third transistor, and a tenth transistor having a current path coupled between the seventh resistor and the first current path terminal of the first transistor, wherein a second intermediate node between the seventh resistor and the current path of the tenth transistor is coupled to the control terminal of the seventh transistor; and a fourth pair of transistors comprising:

an eleventh transistor having a current path coupled between the sixth resistor and the first current path terminal of the second transistor, wherein a third intermediate node between the sixth resistor and the current path of the eleventh transistor is coupled to the control terminal of the fourth transistor, and a twelfth transistor having a current path coupled between the eighth resistor and the first current path terminal of the second transistor, wherein a fourth intermediate node between the eighth resistor and the current path of the twelfth transistor is coupled to the control terminal of the eighth transistor, wherein selecting the first output impedance further comprises turning on the ninth and eleventh transistors, turning off the tenth and twelfth transistors, closing the first and second switches, and opening the third and fourth switches, and wherein selecting the second output impedance further comprises turning off the ninth and eleventh transistors, turning on the tenth and twelfth transistors, opening the first and second switches, and closing the third and fourth switches.

17. The electronic circuit of claim 12, further comprising an output common mode control circuit configured to supply the first supply voltage based on a reference voltage, wherein selecting the first output impedance further comprises setting the reference voltage to a first voltage, and wherein selecting the second output impedance further comprises setting the reference voltage to a second voltage different from the first voltage.

18. The electronic circuit of claim 1, further comprising a second supply terminal configured to receive a second supply voltage that is lower than the first supply voltage, wherein the second current path terminals of the first, second, fifth, and sixth transistors are coupled to the second supply terminal.

19. The electronic circuit of claim 1, wherein the first, second, third, fourth, fifth, and sixth transistors are bipolar junction transistors (BJTs).

20. The electronic circuit of claim 1, wherein the first, second, third, fourth, fifth, and sixth transistors are transistors of the n-type.

21. The electronic circuit of claim 1, further comprising:
a further circuit;
a first transmission line coupled between a first input of the further circuit and the first output terminal; and
a second transmission line coupled between a second input of the further circuit and the second output terminal.

22. The electronic circuit of claim 1, further comprising a first current source coupled to the second current path terminal of the fifth transistor, the first current source configured to generate a first reference current based on a PTAT current.

23. The electronic circuit of claim 1, wherein the electronic circuit is a hard-disk drive (HDD) preamplifier circuit further comprising a low-noise amplifier having an input configured to be coupled to a magnetoresistance (MR) sensor, and a variable gain amplifier having an input coupled to an output of the low-noise amplifier and first and second outputs respectively coupled to the first and second input terminals, wherein the electronic circuit is configured to read data from a magnetic disk using the MR sensor.

24. A method comprising:
receiving a first supply voltage at a first supply terminal;
receiving a differential input voltage between first and second input terminals with an input differential pair comprising:
a first transistor having a control terminal coupled to the first input terminal, and a first current path terminal coupled to the first supply terminal, and
a second transistor having a control terminal coupled to the second input terminal, and a first current path terminal coupled to the first supply terminal;
generating a differential output voltage between first and second output terminals based on the differential input voltage by using a first pair of transistors in emitter-follower configuration, and an output differential pair;
wherein the first pair of transistors comprises:
a third transistor having a control terminal coupled to the first current path terminal of the first transistor, a first current path terminal coupled to the first supply terminal, and a second current path terminal coupled to the first output terminal, and
a fourth transistor having a control terminal coupled to the first current path terminal of the second transistor, a first current path terminal coupled to the first supply terminal, and a second current path terminal coupled to the second output terminal;
wherein the output differential pair comprises:
a fifth transistor having a control terminal coupled to a second current path terminal of the first transistor, and a first current path terminal coupled to the first output terminal, and
a sixth transistor having a control terminal coupled to a second current path terminal of the second transistor, and a first current path terminal coupled to the second output terminal;
wherein a first termination resistor is coupled between the second current path terminal of the third transistor and the first current path terminal of the fifth transistor; and
wherein a second termination resistor is coupled between the second current path terminal of the fourth transistor and the first current path terminal of the sixth transistor.

25. The method of claim 24, further comprising:
selecting a first output impedance at the first and second output terminal by turning off seventh and eighth transistors and turning on the third and fourth transistors, wherein the seventh transistor comprises a control terminal coupled to the first current path terminal of the first transistor, a first current path terminal coupled to the first supply terminal, and a second current path terminal coupled to the first output terminal, wherein the eighth transistor comprises a control terminal coupled to the first current path terminal of the second transistor, a first current path terminal coupled to the first supply terminal, and a second current path terminal coupled to the second output terminal, wherein a third termination resistor is coupled between the second current path terminal of the seventh transistor and the first current path terminal of the fifth transistor, and wherein a fourth termination resistor is coupled between the second current path terminal of the eighth transistor and the first current path terminal of the sixth transistor; or
selecting a second output impedance at the first and second output terminal by turning on the seventh and eighth transistors and turning off the third and fourth transistors.

26. The method of claim 25, wherein the selecting the first or second output impedance comprises using a register bit.

27. The method of claim 25, further comprising, selecting the first output impedance, and, after selecting the first output impedance, selecting the second output impedance.

28. The method of claim 24, wherein a frequency of the differential input voltage is higher than 4 GHz.

29. A differential driver comprising:
first and second input terminals configured to receive a differential input voltage;
first and second output terminals configured to provide a differential output voltage based on the differential input voltage;
a first supply terminal configured to receive a first supply voltage;
an input differential pair comprising:
   a first transistor having a control terminal coupled to the first input terminal, and a first current path terminal coupled to the first supply terminal, and
   a second transistor having a control terminal coupled to the second input terminal, and a first current path terminal coupled to the first supply terminal;
a first pair of transistors in emitter-follower configuration comprising:
   a third transistor having a control terminal coupled to the first current path terminal of the first transistor, a first current path terminal coupled to the first supply terminal, and a second current path terminal coupled to the first output terminal, and
   a fourth transistor having a control terminal coupled to the first current path terminal of the second transistor, a first current path terminal coupled to the first supply terminal, and a second current path terminal coupled to the second output terminal;
an output differential pair comprising:
   a fifth transistor having a control terminal coupled to a second current path terminal of the first transistor, and a first current path terminal coupled to the first output terminal, and
   a sixth transistor having a control terminal coupled to a second current path terminal of the second transistor, and a first current path terminal coupled to the second output terminal;
a first termination resistor coupled between the second current path terminal of the third transistor and the first current path terminal of the fifth transistor;
a second termination resistor coupled between the second current path terminal of the fourth transistor and the first current path terminal of the sixth transistor;
a first degeneration resistor coupled between a second current path terminal of the fifth transistor and a second current path terminal of the sixth transistor;
a second pair of transistors in emitter-follower configuration comprising:
   a seventh transistor having a control terminal coupled to the first current path terminal of the first transistor, a first current path terminal coupled to the first supply terminal, and a second current path terminal coupled to the first output terminal, and
   an eighth transistor having a control terminal coupled to the first current path terminal of the second transistor, a first current path terminal coupled to the first supply terminal, and a second current path terminal coupled to the second output terminal;
a third termination resistor coupled between the second current path terminal of the seventh transistor and the first current path terminal of the fifth transistor; and
a fourth termination resistor coupled between the second current path terminal of the eighth transistor and the first current path terminal of the sixth transistor.

* * * * *